(12) United States Patent
Wegner

(10) Patent No.: US 12,421,590 B2
(45) Date of Patent: Sep. 23, 2025

(54) DISPERSION-HARDENED PRECIOUS-METAL ALLOY

(71) Applicant: HERAEUS DEUTSCHLAND GMBH & CO. KG, Hanau (DE)

(72) Inventor: Matthias Wegner, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 280 days.

(21) Appl. No.: 18/454,597

(22) Filed: Aug. 23, 2023

(65) Prior Publication Data

US 2023/0392248 A1 Dec. 7, 2023

Related U.S. Application Data

(62) Division of application No. 17/445,275, filed on Aug. 17, 2021, now Pat. No. 11,781,208.

(30) Foreign Application Priority Data

Sep. 17, 2020 (EP) .................................. 20196582

(51) Int. Cl.
- C23C 8/12 (2006.01)
- C22C 1/02 (2006.01)
- C22C 5/04 (2006.01)
- C30B 35/00 (2006.01)

(52) U.S. Cl.
CPC ................ C23C 8/12 (2013.01); C22C 1/02 (2013.01); C22C 5/04 (2013.01); C30B 35/002 (2013.01)

(58) Field of Classification Search
None
See application file for complete search history.

(56) References Cited

U.S. PATENT DOCUMENTS

| | | | |
|---|---|---|---|
| 2,636,819 A | 4/1953 | Streicher | |
| 4,507,156 A | 3/1985 | Roehrig | |
| 5,623,725 A | 4/1997 | Disam et al. | |
| 2002/0056491 A1* | 5/2002 | Manhardt | C03B 5/1675 148/242 |
| 2008/0295925 A1 | 12/2008 | Manhardt et al. | |
| 2010/0276646 A1* | 11/2010 | Manhardt | C22C 5/04 148/194 |

FOREIGN PATENT DOCUMENTS

| | | | | |
|---|---|---|---|---|
| CN | 106111725 A | | 11/2016 | |
| CN | 108149055 A | * | 6/2018 | ............... B22F 3/18 |
| DE | 2355122 A1 | | 5/1975 | |
| EP | 0683240 A2 | | 11/1995 | |
| EP | 870844 A1 | * | 10/1998 | |
| EP | 0947595 A2 | | 10/1999 | |
| EP | 1188844 A1 | | 3/2002 | |
| EP | 1295953 A1 | | 3/2003 | |
| EP | 1964938 A1 | | 9/2008 | |
| GB | 1280815 A | | 7/1972 | |
| GB | 1340076 A | | 12/1973 | |
| GB | 2082205 A | | 3/1982 | |
| WO | 8101013 A1 | | 4/1981 | |
| WO | 2015082630 A1 | | 6/2015 | |

OTHER PUBLICATIONS

English language machine translation of CN-106111725-A. Generated Feb. 17, 2023. (Year: 2023).

* cited by examiner

*Primary Examiner* — Brian D Walck
(74) *Attorney, Agent, or Firm* — Blank Rome LLP

(57) ABSTRACT

Methods of making dispersion-hardened platinum compositions include A) producing a melt having at least 70 wt. % platinum, up to 29.95 wt. % of one or more of rhodium, gold, iridium and palladium, between 0.05 wt. % and 1 wt. % of oxidizable non-precious metals in the form of zirconium, yttrium and scandium, and, as the remainder, platinum including impurities, wherein the ratio of zirconium to yttrium in the melt is in a range of from 5.9:1 to 4.3:1 and the ratio of zirconium to scandium in the melt is at least 17.5:1, B) hardening the melt to form a solid body, C) processing the solid body to form a volume body, and D) oxidizing the non-precious metals contained in the volume body by a heat treatment in an oxidizing medium over a time period of at least 48 hours at a temperature of at least 750° C.

19 Claims, No Drawings

DISPERSION-HARDENED PRECIOUS-METAL ALLOY

CROSS REFERENCE TO RELATED APPLICATIONS

This application is a divisional of U.S. Non-provisional application Ser. No. 17/445,275 filed Aug. 17, 2021, which claims the benefit of Europe Application No. EP 20196582.9, filed Sep. 17, 2020, the entire contents of which are incorporated by reference herein.

DESCRIPTION

The invention relates to a platinum composition and to a crucible for crystal growing, a semi-finished product, a tool, a tube, a stirrer, a fiberglass nozzle or a component for producing or processing glass made of a platinum composition of this kind and to a method for the producing a platinum composition of this kind by melting metallurgy. In this case, the platinum composition consists of at least 70 wt. % platinum (Pt) and contains oxides of the non-precious metals zirconium (Zr), yttrium (Y) and scandium (SC).

Molded bodies made of platinum are frequently used in high-temperature processes in which the material must have high corrosion resistance. For example, in the glass industry, components made of platinum are used which are mechanically loaded, such as stirrers or fiberglass nozzle bushings. A drawback of platinum as a material is, however, its low mechanical strength at high temperatures. Therefore, in general, dispersion-hardened platinum compositions are used for the above-mentioned high-temperature processes. Dispersion-hardened platinum compositions are therefore used in particular in the specialty-glass and fiberglass industry, but are also used in crystal growth.

The production, processing and the physical properties of dispersion-hardened platinum compositions of this kind are known, for example, from GB 1 280 815 A, GB 1 340 076 A, GB 2 082 205 A, EP 0 683 240 A2, EP 0 870 844 A1, EP 0 947 595 A2, EP 1 188 844 A1, EP 1 295 953 A1, EP 1 964 938 A1, U.S. Pat. Nos. 2,636,819 A, 4,507,156 A, DE 23 55 122 A1, WO 81/01013 A1 and WO 2015/082630 A1.

Dispersion-solidified platinum compositions are usually produced by powder metallurgy or melting metallurgy by alloying zirconium (Zr) and optionally other non-precious metals such as yttrium (Y) or scandium (Sc), which are oxidized in a subsequent oxidation process to form zirconia ($ZrO_2$), yttrium oxide ($Y_2O_3$) and scandium oxide ($SC_2O_3$).

The production of dispersion-solidified alloys is a complex and time-consuming process. The oxidation time is required to form dispersoids in the compact volume body obtained from the melt (cf. for example WO 2015/082630 A1) by internal oxidation by oxygen being diffused into the volume body.

It is therefore the object of the invention to overcome the drawbacks of the prior art. In particular, a platinum composition and components produced therefrom which can be produced in a cost-effective and simple manner are intended to be provided. At the same time, the platinum composition and the components produced therefrom are intended to have the greatest possible creep strength at high temperatures. As a result, the platinum composition and the components produced therefrom can be used at high temperatures under mechanical load.

By means of the invention, the mechanical properties are intended to be improved and the process costs are intended to be reduced as well. In general, platinum compositions of this kind are primarily used at high application temperatures under corrosive conditions in combination with a significant mechanical load, such as in the form of stirrers or other tools and components, in the form of fiberglass nozzles or crucibles for glass melts.

The objects of the invention are achieved by a dispersion-hardened platinum composition comprising at least 70 wt. % platinum, the platinum composition containing up to 29.95 wt. % of one of the metals rhodium, gold, iridium and palladium or of a mixture of at least two of the metals rhodium, gold, iridium and palladium, the platinum composition containing between 0.05 wt. % and 1 wt. % oxides of the non-precious metals zirconium, yttrium and scandium, and the platinum composition containing, as the remainder, the platinum including impurities, wherein between 7.0 mol. % and 11.0 mol. % of the oxides of the non-precious metals is yttrium oxide, between 0.1 mol. % and 5.0 mol. % of the oxides is scandium oxide, and the remainder of the oxides is zirconia, including oxide impurities.

The platinum composition is preferably a platinum-based alloy. A platinum-based alloy is understood to be an alloy which consists of at least 50 at. % platinum.

Preferably, 0.1 wt. % to 0.7 wt. %, particularly preferably 0.15 wt. % and 0.6 wt. % and most preferably 0.2 wt. % to 0.5 wt. % of the oxides of the non-precious metals are contained in the dispersion-hardened platinum composition. High proportions of non-precious metal oxides result in longer service lives of volume bodies manufactured from the platinum composition under mechanical load. Volume bodies having low proportions of non-precious metal oxides exhibit advantages with regard to the processability, for example weldability or moldability, of the volume bodies. The term "volume body" should be interpreted broadly here. Preferably, a volume body may for example be in the form of metal sheet, a tube or a wire.

The dispersion-hardened platinum composition according to the invention comprises at least 70 wt. % platinum and up to 29.95 wt. % of at least one of the metals rhodium, gold, iridium and palladium. Accordingly, the composition may substantially consist of platinum and the above oxides of the non-precious metals zirconium, yttrium and scandium. The platinum composition may therefore be pure platinum, except for impurities that are usual or result from the production process, in which the oxides of the non-precious metals zirconium, yttrium and scandium are distributed. Furthermore, however, the platinum composition may also comprise other precious metals, namely rhodium, gold, iridium and palladium, the platinum composition being a platinum-based alloy in this case.

The impurities in the precious metals and the non-precious metals or oxides are understood to be usual impurities which get into the starting material due to and as part of the design process or which could not be (completely) removed from the raw materials with reasonable effort.

It may be provided that the oxides of the non-precious metals zirconium, yttrium and scandium are completely oxidized at least by 70%, preferably are oxidized at least by 90%, and particularly preferably are completely oxidized.

As a result, a particularly intensively hardened platinum composition is achieved.

Preferably, the non-precious metals are oxidized with oxygen at least by 70%, particularly preferably at least by 90%. Here, all the oxidation states of the non-precious metals are taken into account such that preferably at most 30%, particularly preferably at most 10%, of the non-precious metals are present as a metal, i.e. in the formal oxidation state 0.

Furthermore, it may be provided that the total proportion of impurities in the platinum composition is at most 1 wt. %, preferably at most 0.5 wt. %.

This ensures that the physical properties of the platinum composition are not influenced by the impurities, or are influenced by the impurities as little as possible.

It may also be provided that at least 50 mol. % of the oxides of the non-precious metals are cubic zirconia stabilized with yttrium oxide and/or scandium oxide, and preferably at least 80 mol. % of the oxides of the non-precious metals are cubic zirconia stabilized with yttrium oxide and/or scandium oxide.

It has been found that the oxygen diffusibility along the oxides can be increased by these measures. As a result, high oxygen diffusibility through the oxidation regions and therefore good oxidizability of the non-precious metals zirconium, yttrium and scandium in the platinum composition is achieved. As a result, the platinum composition can be hardened in a particularly short time by oxidative precipitation.

Preferably, it may be provided that the platinum composition is not produced by powder metallurgy.

Furthermore, it may be provided that the platinum composition is produced by melting metallurgy, is then rolled out and is oxidized by heat treatment in an oxidizing medium such that the non-precious metals contained in the platinum composition are completely oxidized.

As a result, a particularly well-hardened platinum composition is achieved.

According to a preferred development, it may be provided that the ratio of yttrium oxide to scandium oxide in the platinum composition is in a range of from 2.6:1 to 10:1.

In this range, a particularly short time required for forming the precipitation by oxidation of the non-precious metals zirconium, yttrium and scandium surprisingly resulted.

A ratio (or mixing ratio) of yttrium oxide to scandium oxide of at least 2.6:1 and at most 10:1 means that the number of moles or molecules of yttrium oxide in the platinum composition is at least 2.6 times greater than the number of moles or molecules of scandium oxide in the oxides of the non-precious metals of the platinum composition and is at most 10 times greater than the number of moles or molecules of scandium oxide in the oxides of the non-precious metals of the platinum composition.

Furthermore, it may be provided that between 8.0 and 10.0 mol. % of the oxides is yttrium oxide.

In this composition range, the material can be oxidized more rapidly than in the adjacent composition ranges containing slightly more or less yttrium oxide.

Furthermore, it may be provided that the platinum composition contains at least 80 wt. % platinum including impurities, the platinum composition preferably containing up to 10 wt. % gold or up to 19.95 wt. % rhodium.

Owing to the higher platinum content, the platinum composition can be manufactured more cost-effectively.

Furthermore, it may be provided that the platinum composition contains at least 1 wt. % rhodium, gold, palladium or iridium, the platinum composition preferably containing at least 5 wt. % rhodium and/or at least 3 wt. % gold.

As a result, a greater hardness of the platinum composition can be achieved and the mechanical properties can be adapted to certain requirements. Gold also positively influences the wetting properties of the platinum composition with a glass melt.

It may also be provided that the platinum composition contains between 5 wt. % and 20 wt. % rhodium and no gold, iridium or palladium, except for impurities, or the platinum composition contains between 2 wt. % and 10 wt. % gold and no rhodium, iridium or palladium, except for impurities.

These platinum compositions are particularly well suited to high-temperature applications owing to their mechanical and chemical stability.

Furthermore, it may be provided that the platinum composition consists of 10 wt. % rhodium, the oxides of the non-precious metals zirconium, yttrium and scandium, and, as the remainder, platinum including impurities, or the platinum composition consists of 5 wt. % gold, the oxides of the non-precious metals zirconium, yttrium and scandium, and, as the remainder, platinum including impurities.

These platinum compositions are particularly well suited to high-temperature applications owing to their mechanical and chemical stability.

Furthermore, it may be provided that the platinum composition has a creep strength of at least 500 h at 1400° C. under a load of 20 MPa.

Platinum compositions having these physical properties are producible by the oxidation of the non-precious metals zirconium, yttrium and scandium.

The objects of the present invention are also achieved by a crucible for crystal growing, a semi-finished product, a tool, a tube, a stirrer, a fiberglass nozzle or a component for producing or processing glass consisting of or having a platinum composition according to any one of the preceding claims or a temperature sensor having one of the previously described platinum compositions.

Crucibles, semi-finished products, fiberglass nozzles, stirrers, tubes, temperature sensors, tools or components for producing or processing glass made of or having a platinum composition of this kind are particularly well suited to storing, conducting and processing glass melts and contact with glass melts owing to the chemical high-temperature resistance and mechanical strength.

The objects of the present invention are also achieved by a method for producing a platinum composition comprising the following chronological steps:

A) producing a melt having at least 70 wt. % platinum, up to 29.95 wt. % of one of the metals rhodium, gold, iridium and palladium or of a mixture of at least two of the metals rhodium, gold, iridium and palladium, between 0.05 wt. % and 1 wt. % oxidizable non-precious metals in the form of zirconium, yttrium and scandium, and, as the remainder, platinum including impurities, wherein the ratio of zirconium to yttrium in the melt is in a range of from 5.9:1 to 4.3:1 and the ratio of zirconium to scandium in the melt is at least 17.5:1.
B) hardening the melt to form a solid body,
C) processing the solid body to form a volume body; and
D) oxidizing the non-precious metals contained in the volume body by a heat treatment in an oxidizing medium over a time period of at least 48 hours at a temperature of at least 750° C.

When processing the solid body to form a volume body, the solid body is reshaped and a desired volume form is produced in a targeted manner.

The oxidation time depends on the thickness of the material to be oxidized owing to the average diffusion length of the oxygen. The greater the material thickness, the longer the oxidation time required. The 48 hours relates to a metal sheet having a thickness of 0.5 mm. The oxidation time increases for thicker metal sheets. Similarly, an increase in the temperature results in the oxidation time being shortened.

In the method according to the invention, it may be provided that a platinum composition according to the invention or as described above is produced by means of the method.

The method then has the advantages set out for the platinum compositions.

Furthermore, it may be provided that, during the oxidation in step D), the oxygen is diffused through the solid body and cubic zirconia stabilized by yttrium oxide and/or scandium oxide is transported by means of oxygen ion conduction.

As a result, particularly rapid oxidation of the non-precious metals zirconium, yttrium and scandium and therefore particularly rapid hardening of the platinum composition is achieved.

It may also be provided that, during the oxidation in step D), dispersion hardening is carried out by yttrium-oxide-stabilized and/or scandium-oxide-stabilized zirconia particles precipitated from the metal matrix of the solid body.

In this way, the platinum composition is relatively rapidly (in comparison with the prior art) hardened in an advantageous form and with a dense solid body.

The invention is based on the surprising finding that the platinum compositions according to the invention can be produced significantly more rapidly and therefore more cost-effectively than the platinum compositions produced in the prior art using comparable methods. At the same time, the mechanical high-temperature properties of the platinum composition are further improved, in particular with regard to the high-temperature creep strength. It has been found as part of the present invention that the claimed composition surprisingly allows for particularly rapid oxidizability and therefore particularly rapid formation of dispersoids in the platinum composition. The fact that this finding is surprising also explains why other oxides of non-precious metals, investigated as part of the present invention, for stabilizing the zirconia, such as a combination of scandium and niobium, have the effect of worsening the oxidation time, even though zirconia stabilized by such a combination exhibits particularly high stability and oxygen diffusibility.

It has been found as part of the present invention that, by using zirconium, yttrium and scandium in the stated proportions as oxide formers, the process times can be shortened, meaning that the process costs are reduced.

The invention succeeds in reducing the oxidation time (for forming the dispersoids) in comparison with the prior art by more than 25% (in comparison with the prior art, for example in comparison with the PtRh10 alloys produced in accordance with WO 2015/082630 A1). At the same time, an improvement in the high-temperature properties (in particular the creep strength/creep resistance) in comparison with WO 2015/082630 A1 (see Table 1 therein) using a platinum composition according to the invention results in a creep strength of over 1000 hours being achievable under a mechanical load of 9 MPa, and/or the same creep strength as in example 1 of WO 2015/082630 A1 under a load of 20 MPa is achieved, for a dispersion-solidified PtRh10 alloy at 1600° C. The concept is likewise transferable to other dispersion-solidified alloys, with comparable added value being expectable.

The oxidation process, in which the zirconium, yttrium and scandium that is first dissolved in the platinum matrix or in the precious-metal matrix is oxidized, depends on many factors, including the temperature or the diffusion coefficient (this is a thermally activated, diffusion-controlled process), the oxygen solubility in the matrix material, the oxygen partial pressure, the concentration of the oxide-former, the composition of the forming oxide, and the interface between the oxide and metal matrix. The ion conductivity is influenced by the composition of the oxides. High ion conductivity can accelerate the oxidation process, but is only one of many parameters that can result in an improvement in the oxidizability.

By optimizing the molar composition (molar ratio) of the oxide formers (i.e. the non-precious metals), the present invention succeeds in reducing the oxidation time in the solid body while simultaneously improving the high-temperature properties, the latter additionally being carried out by slightly increasing the total quantity of oxide formers.

Exemplary embodiments of the invention are explained below without, however, limiting the invention.

The platinum compositions described in the following were produced by an ingot having a weight of 10 kg being cast from the melt by vacuum induction melting (exemplary embodiments 1-4). In addition, circular blanks having a weight of 200 g each were produced by arc melting (exemplary embodiments 5-9). In this way, different platinum compositions containing 10 wt. % rhodium were produced. The non-precious metals zirconium, yttrium and scandium were added during the melting process. A 3 mm or 2 mm thick metal sheet of the platinum composition was produced by rolling and tempering. The thus produced metal sheet was then subjected to oxidation annealing in order to oxidize the non-precious metals. This kind of processing is set out in WO 2015/082630 A1 (in the semi-finished product preliminary stage example 3). The metal sheet was then subjected to thermomechanical processing. This thermomechanical processing is described in WO 2015/082630 A1 (as comprised in the claims).

The mechanical high-temperature properties were then determined by experimentation. To do this, the creep strength was tested by means of creep tests in different load states.

The test setup is guided by DIN EN ISO 204. Deviations from the standard result from the high test temperatures, for which no guidelines are set out in the standard. The sample is heated, connected in the form of a resistance heater, and is loaded with a static, uniaxial load. The temperature is measured by means of a pyrometer and the resulting, time-dependent strain is determined by means of an optical extensometer.

The degree of oxidation of an alloy can be determined by ascertaining the oxygen content. The oxygen content of the alloy is determined by quantitative IR spectroscopy using a device from LECO (ONH836). A defined sample quantity is melted in a graphite crucible. The oxygen present in the material reacts with the carbon of the graphite crucible under formation of $CO/CO_2$. The gases released are flushed out of the furnace and through a mass flow controller by an inert gas. In another step, the CO present is oxidized to form $CO_2$. The oxygen present is then spectroscopically identified as $CO_2$ using an NDIR sensor. With the knowledge of the chemical composition of the alloy, the degree of oxidation can then be calculated from the measured oxygen.

COMPARATIVE EXAMPLE 1

10 wt. % rhodium, 1830 ppm zirconium, 295 ppm yttrium, 50 ppm scandium and the remainder platinum including usual impurities.

This corresponds to a mole fraction of the oxide of the non-precious metal in the oxidized state of the platinum composition of 7.5 mol. % $Y_2O_3$ (yttrium oxide), 2.5 mol. % $Sc_2O_3$ (scandium oxide) and the remainder $ZrO_2$ (zirconia).

The oxidation of the non-precious metals of the 3 mm thick metal sheet takes place in the air at 900° C. After an oxidation time of 27 days, >90% of the non-precious metals in the metal sheet were oxidized. The metal sheet was then ductility-annealed at 1400° C. for 6 hours and thermomechanically processed as disclosed in WO 2015/082630 A1. As a result, a creep strength of 3 hours is brought about at 1400° C. and 20 MPa and a creep strength of 50 hours is brought about at 1600° C. and 9 MPa.

COMPARATIVE EXAMPLE 2

10 wt. % rhodium, 1830 ppm zirconium, 295 ppm yttrium, 50 ppm scandium and the remainder platinum including usual impurities.

This corresponds to a mole fraction of the oxide of the non-precious metal in the oxidized state of the platinum composition of 7.5 mol. % $Y_2O_3$ (yttrium oxide), 2.5 mol. % $Sc_2O_3$ (scandium oxide) and the remainder $ZrO_2$ (zirconia).

The oxidation of the non-precious metals of the 3 mm thick metal sheet takes place in the air at 1000° C. After an oxidation time of 9 days, >90% of the non-precious metals in the metal sheet were oxidized. The metal sheet was then ductility-annealed at 1400° C. for 6 hours and the metal sheet was thermomechanically processed as disclosed in WO 2015/082630 A1. As a result, a creep strength of 0.5 hours is brought about at 1400° C. and 20 MPa and a creep strength of 3 hours is brought about at 1600° C. and 9 M Pa.

EXAMPLE 3 (INVENTION)

10 wt. % rhodium, 2770 ppm zirconium, 546 ppm yttrium, 63 ppm scandium and the remainder platinum including usual impurities.

This corresponds to a mole fraction of the oxide of the non-precious metal in the oxidized state of the platinum composition of 9.0 mol. % $Y_2O_3$ (yttrium oxide), 2.0 mol. % $Sc_2O_3$ (scandium oxide) and the remainder $ZrO_2$ (zirconia).

The oxidation of the non-precious metals of the 3 mm thick metal sheet takes place in the air at 900° C. After an oxidation time of just 19 days, >90% of the non-precious metals in the metal sheet were oxidized. The metal sheet was then ductility-annealed at 1400° C. for 6 hours and the metal sheet was thermomechanically processed as disclosed in WO 2015/082630 A1. As a result, a creep strength of over 500 hours is brought about at 1400° C. and 20 MPa and a creep strength of over 1000 hours is brought about at 1600° C. and 9 MPa.

EXAMPLE 4 (INVENTION)

10 wt. % rhodium, 2770 ppm zirconium, 546 ppm yttrium, 63 ppm scandium and the remainder platinum including usual impurities.

This corresponds to a mole fraction of the oxide of the non-precious metal in the oxidized state of the platinum composition of 9.0 mol. % $Y_2O_3$ (yttrium oxide), 2.0 mol. % $Sc_2O_3$ (scandium oxide) and the remainder $ZrO_2$ (zirconia).

The oxidation of the non-precious metals of the 3 mm thick metal sheet takes place in the air at 1000° C. After an oxidation time of just 6 days, >90% of the non-precious metals in the metal sheet were oxidized.

By optimizing the molar composition, i.e. the molar ratio of the oxide-forming non-precious metals, and by increasing the total quantity of oxide-forming non-precious metals (from 2150 ppm to 3400 ppm), the invention succeeds in reducing the oxidation time in the solid body by >25% while simultaneously improving the high-temperature properties.

EXAMPLE 5 (INVENTION)

10 wt. % rhodium, 2710 ppm zirconium, 511 ppm yttrium, 65 ppm scandium and the remainder platinum including impurities. A circular blank of 200 g was produced by means of arc melting.

This corresponds to a mole fraction of the oxide of the non-precious metal in the oxidized state of the platinum composition of 8.6 mol. % $Y_2O_3$ (yttrium oxide), 2.2 mol. % $Sc_2O_3$ (scandium oxide) and the remainder $ZrO_2$ (zirconia).

The oxidation of the non-precious metals of the 2 mm thick metal sheet takes place in the air at 900° C. After an oxidation time of just 10 days, >90% of the non-precious metals in the metal sheet were oxidized. The metal sheet was then ductility-annealed at 1400° C. for 6 hours and the metal sheet was thermomechanically processed as disclosed in WO 2015/082630 A1. As a result, a creep strength of over 500 hours is brought about at 1400° C. and 20 MPa and a creep strength of over 1000 hours is brought about at 1600° C. and 9 MPa.

COMPARATIVE EXAMPLE 6

10 wt. % rhodium, 1870 ppm zirconium, 313 ppm yttrium, 33 ppm scandium and the remainder platinum including usual impurities. A circular blank of 200 g was produced by means of arc melting.

This corresponds to a mole fraction of the oxide of the non-precious metal in the oxidized state of the platinum composition of 7.8 mol. % $Y_2O_3$ (yttrium oxide), 1.6 mol. % $Sc_2O_3$ (scandium oxide) and the remainder $ZrO_2$ (zirconia).

The oxidation of the non-precious metals of a 2 mm thick metal sheet takes place in the air at 900° C. After an oxidation time of 20 days, >90% of the non-precious metals in the metal sheet were oxidized. The metal sheet was then ductility-annealed at 1400° C. for 6 hours and the metal sheet was thermomechanically processed as disclosed in WO 2015/082630 A1. It results in a creep strength analogously to comparative example 1.

For the further comparison, three additional comparative tests were carried out in which a combination of scandium oxide and niobium oxide ($Nb_2O_5$) instead of yttrium oxide and scandium oxide was introduced into the platinum composition for stabilizing the oxygen-ion-conducting cubic zirconia phase.

The platinum compositions described in the following were produced by circular blanks having individual weights of 200 g each being produced by arc melting. In this way, 3 different platinum compositions containing 10 wt. % rhodium, 200 ppm scandium and variable proportions of niobium were produced. A 2 mm thick metal sheet of the platinum composition was produced by rolling and tempering.

The proportion of the oxidized non-precious metals in the platinum composition was then determined by quantitative IR spectroscopy.

COMPARATIVE EXAMPLE 7

10 wt. % rhodium, 1800 ppm zirconium, 80 ppm niobium, 200 ppm scandium and the remainder platinum including usual impurities.

This corresponds to a mole fraction of the oxide of the non-precious metal in the oxidized state of the platinum composition of 2.0 mol. % $Nb_2O_5$ (niobium oxide), 10.0 mol. % $Sc_2O_3$ (scandium oxide) and the remainder $ZrO_2$ (zirconia).

The oxidation of the non-precious metals of the 2 mm thick metal sheet takes place in the air at 900° C. After an oxidation time of 20 days, only 39% of the non-precious metals in the metal sheet were oxidized.

COMPARATIVE EXAMPLE 8

10 wt. % rhodium, 1800 ppm zirconium, 40 ppm niobium, 200 ppm scandium and the remainder platinum including usual impurities.

This corresponds to a mole fraction of the oxide of the non-precious metal in the oxidized state of the platinum composition of 1.0 mol. % $Nb_2O_5$ (niobium oxide), 10.0 mol. % $Sc_2O_3$ (scandium oxide) and the remainder $ZrO_2$ (zirconia).

The oxidation of the non-precious metals of the 2 mm thick metal sheet takes place in the air at 900° C. After an oxidation time of 20 days, only 42% of the non-precious metals in the metal sheet were oxidized.

COMPARATIVE EXAMPLE 9

10 wt. % rhodium, 1800 ppm zirconium, 20 ppm niobium, 200 ppm scandium and the remainder platinum including usual impurities.

This corresponds to a mole fraction of the oxide of the non-precious metal in the oxidized state of the platinum composition of 0.5 mol. % $Nb_2O_5$ (niobium oxide), 10.0 mol. % $Sc_2O_3$ (scandium oxide) and the remainder $ZrO_2$ (zirconia).

The oxidation of the non-precious metals of the 2 mm thick metal sheet takes place in the air at 900° C. After an oxidation time of 20 days, only 36% of the non-precious metals in the metal sheet were oxidized.

The oxidation time in comparative examples 6, 7 and 8 was therefore considerably worse than in comparative example 5. This shows that a direct conclusion cannot be drawn on the oxidizability or oxidation time of the platinum composition from the oxygen ion conductivity of the oxides.

The measurements show that, for the platinum composition, there is no simple connection such that an oxide having high ion conductivity would bring about an acceleration of the oxidation process. Accordingly, the selection of non-precious metals according to the invention in the platinum composition according to the invention results in surprising success.

The features of the invention disclosed in the above description, as well as in the claims, drawings and exemplary embodiments, may be essential both individually and in any combination for realizing the invention in its various embodiment forms.

What is claimed is:

1. A method for producing a platinum composition comprising the following chronological steps:
    A) producing a melt having at least 70 wt. % platinum, up to 29.95 wt. % of one or more of rhodium, gold, iridium and palladium, between 0.05 wt. % and 1 wt. % of oxidizable non-precious metals in the form of zirconium, yttrium and scandium, and, as the remainder, platinum including impurities, wherein the ratio of zirconium to yttrium in the melt is in a range of from 5.9:1 to 4.3:1 and the ratio of zirconium to scandium in the melt is at least 17.5:1;
    B) hardening the melt to form a solid body;
    C) processing the solid body to form a volume body; and
    D) oxidizing the non-precious metals contained in the volume body by a heat treatment in an oxidizing medium over a time period of at least 48 hours at a temperature of at least 750° C.

2. The method of claim 1, wherein
during the oxidation in step D), the oxygen is diffused through the solid body and cubic zirconia stabilized by yttrium oxide and/or scandium oxide is transported by means of oxygen ion conduction.

3. The method of claim 1, wherein
during the oxidation in step D), dispersion hardening is carried out by yttrium-oxide-stabilized and/or scandium-oxide-stabilized zirconia particles precipitated from the metal matrix of the solid body.

4. The method of claim 1, wherein
during the processing in step C), the solid body is reshaped and a volume form is produced in a targeted manner.

5. The method of claim 1, wherein
the time period for oxidation in step D) is chosen depending on the thickness of the material to be oxidized owing to the average diffusion length of the oxygen such that the greater the material thickness, the longer the time period for oxidation is chosen.

6. The method of claim 1, wherein
the time period of at least 48 hours in step D) relates to a metal sheet having a thickness of 0.5 mm and the time period for oxidation increases for thicker metal sheets.

7. The method of claim 1, wherein
during the oxidation in step D), at least 70% of the zirconium, yttrium and scandium are oxidized to zirconium oxide ($ZrO_2$), yttrium oxide ($Y_2O_3$) and scandium oxide ($Sc_2O_3$).

8. The method of claim 1, wherein
during the oxidation in step D), at least 50 mol. % of the oxides of the non-precious metals created are cubic zirconia stabilized with yttrium oxide and/or scandium oxide.

9. The method of claim 1, wherein
during producing the melt in step A), a melting metallurgy process is performed; and
during processing the solid body in step C), the solid body is rolled out.

10. The method of claim 1, wherein
during the oxidation in step D), a heat treatment is performed in an oxidizing medium such that the non-precious metals contained in the platinum composition are completely oxidized.

11. The method of claim 1, wherein
after the oxidation in step D), the ratio of yttrium oxide to scandium oxide in the platinum composition in the volume body is in a range of from 2.6:1 to 10:1.

12. The method of claim 1, wherein
after the oxidation in step D), between 8.0 mol. % and 10.0 mol. % of the oxides of the volume body are yttrium oxide.

13. The method of claim 1, wherein
after the oxidation in step D), between 1.0 mol. % and 3.0 mol. % of the oxides of the volume body are scandium oxide.

14. The method of claim 1, wherein
during producing the melt in step A), a melt is produced having at least 80 wt. % platinum and/or containing at least 1 wt. % rhodium, gold, palladium or iridium.

15. The method of claim 1, wherein
after the oxidation in step D), a volume body is obtained containing between 5 wt. % and 20 wt. % rhodium and no gold, iridium or palladium, except for impurities, or containing between 2 wt. % and 10 wt. % gold and no rhodium, iridium or palladium, except for impurities.

16. The method of claim 1, wherein
after the oxidation in step D), a volume body is obtained having a creep strength of at least 500 h at 1400° C. under a load of 20 MPa.

17. The method of claim 1, wherein
after the oxidation in step D), a crucible for crystal growing, a semi-finished product, a tool, a tube, a stirrer, a fiberglass nozzle, a temperature sensor or a component for producing or processing glass is produced from the volume body.

18. The method of claim 1, wherein
during the oxidation in step D), at least 90% of the zirconium, yttrium and scandium are oxidized to zirconium oxide ($ZrO_2$), yttrium oxide ($Y_2O_3$) and scandium oxide ($Sc_2O_3$).

19. The method of claim 1, wherein
during the oxidation in step D), at least 80 mol. % of the oxides of the non-precious metals created are cubic zirconia stabilized with yttrium oxide and/or scandium oxide.

* * * * *